(12) United States Patent
Li et al.

(10) Patent No.: US 11,522,194 B2
(45) Date of Patent: *Dec. 6, 2022

(54) NEGATIVE ELECTRODE PLATE, PREPARATION METHOD THEREOF AND ELECTROCHEMICAL DEVICE

(71) Applicant: Contemporary Amperex Technology Co., Limited, Fujian (CN)

(72) Inventors: Cheng Li, Fujian (CN); Changliang Sheng, Fujian (CN); Huafeng Huang, Fujian (CN); Qisen Huang, Fujian (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 212 days.

This patent is subject to a terminal disclaimer.

(21) Appl. No.: 16/452,542

(22) Filed: Jun. 26, 2019

(65) Prior Publication Data

US 2020/0006775 A1 Jan. 2, 2020

(30) Foreign Application Priority Data

Jun. 29, 2018 (CN) .......................... 201810712609.X

(51) Int. Cl.
*H01M 4/04* (2006.01)
*H01M 4/02* (2006.01)
(Continued)

(52) U.S. Cl.
CPC ......... *H01M 4/628* (2013.01); *C23C 14/0021* (2013.01); *C23C 14/081* (2013.01);
(Continued)

(58) Field of Classification Search
None
See application file for complete search history.

(56) References Cited

U.S. PATENT DOCUMENTS

2006/0281004 A1* 12/2006 Yata ................. H01M 4/587
429/162
2010/0285368 A1* 11/2010 Yamamoto ........ H01M 10/0525
429/231.95
(Continued)

FOREIGN PATENT DOCUMENTS

CN 102473894 A 5/2012
CN 101414676 B 8/2012
(Continued)

OTHER PUBLICATIONS

The extended European search report for European Application No. 19183222.9, dated Oct. 14, 2019, 9 pages.
(Continued)

*Primary Examiner* — Brian R Ohara
*Assistant Examiner* — Patrick Marshall Greene
(74) *Attorney, Agent, or Firm* — East IP P.C.

(57) ABSTRACT

The invention refers to negative electrode plate, preparation method thereof and electrochemical device. The negative electrode plate comprises: a negative current collector, a negative active material layer, and an inorganic dielectric layer which are provided in a stacked manner; the negative active material layer comprises opposite first surface and second surface, wherein the first surface is disposed away from the negative current collector; the inorganic dielectric layer is disposed on the first surface of the negative active material layer and consists of an inorganic dielectric material. The negative electrode plate provided by the application is useful in an electrochemical device, and can result in an electrochemical device having simultaneously excellent safety performance and cycle performance.

9 Claims, 4 Drawing Sheets

(51) Int. Cl.
*H01M 4/62* (2006.01)
*C23C 14/00* (2006.01)
*C23C 14/08* (2006.01)
*C23C 14/30* (2006.01)
*H01M 4/133* (2010.01)
*H01M 4/1393* (2010.01)
*H01M 4/587* (2010.01)

(52) U.S. Cl.
CPC ........... *C23C 14/30* (2013.01); *H01M 4/0404* (2013.01); *H01M 4/0423* (2013.01); *H01M 4/133* (2013.01); *H01M 4/1393* (2013.01); *H01M 4/587* (2013.01); *H01M 2004/021* (2013.01); *H01M 2004/027* (2013.01)

(56) References Cited

U.S. PATENT DOCUMENTS

| | | | | |
|---|---|---|---|---|
| 2013/0177808 A1* | 7/2013 | Wang | ................ | C23C 16/45555 429/219 |
| 2016/0093912 A1 | 3/2016 | Zheng et al. | | |
| 2017/0263935 A1* | 9/2017 | Kozen | ................... | H01M 10/05 |
| 2018/0083282 A1 | 3/2018 | Baba et al. | | |
| 2018/0159177 A1* | 6/2018 | Tsujita | .................... | H01M 4/62 |
| 2020/0168902 A1* | 5/2020 | Yun | ..................... | H01M 10/052 |
| 2020/0212428 A1* | 7/2020 | Han | ....................... | H01M 4/04 |
| 2021/0020898 A1* | 1/2021 | Lee | ......................... | H01M 4/623 |
| 2021/0167393 A1* | 6/2021 | Kuzuoka | ............... | H01M 4/622 |

FOREIGN PATENT DOCUMENTS

| | | |
|---|---|---|
| CN | 103943819 A | 7/2014 |
| CN | 103199299 B | 2/2015 |
| CN | 104701487 A | 6/2015 |
| CN | 103928704 B | 8/2016 |
| CN | 106207087 A | 12/2016 |
| EP | 1083618 A1 | 3/2001 |
| EP | 3301743 A1 | 4/2018 |
| JP | S5952702 A | 3/1984 |
| TW | 201330352 A | 7/2013 |

OTHER PUBLICATIONS

The First Office Action and search report dated Jul. 24, 2020 for Chinese Application No. 201810712609.X, 11 pages.

* cited by examiner

NEGATIVE ELECTRODE PLATE, PREPARATION METHOD THEREOF AND ELECTROCHEMICAL DEVICE

CROSS-REFERENCE TO RELATED APPLICATION

This application claims priority to Chinese Patent Application No. 201810712609.X, filed on Jun. 29, 2018, which is hereby incorporated by reference in its entirety.

TECHNICAL FIELD

The invention belongs to the technical field of energy storage devices, particularly refers to a negative electrode plate, a preparation method thereof and an electrochemical device.

BACKGROUND

Electrochemical device, which can convert chemical energy into electric energy, has advantages including stable voltage and current, reliable performance, simple structure and being easy to carry. It has become the main power source for various consumer electronic products and electric products, and is widely used in all aspects of production and life of mankind. In recent years, the market has placed increasing demands on the cycle performance and safety performance of electrochemical devices.

However, in the existing electrochemical devices, there are many side reactions between electrolyte and negative electrode interface during cycle process, which cause decomposition of electrolyte and gas production, thereby deteriorating safety performance of electrochemical devices and continuously consuming electrolyte cation on negative electrode. Irreversible capacity of the electrochemical device is continuously increased, resulting in rapid decay of cycle life. Moreover, the poor transmission performance of electrolyte cation in negative electrode also causes the formation of metal dendrites on the negative electrode interface, which easily induces short circuit in the electrochemical device and further deteriorates safety performance of electrochemical device.

SUMMARY

The application provides a negative electrode plate, a preparation method thereof and an electrochemical device, to improve safety performance and cycle performance of electrochemical device.

The first aspect of the application provides a negative electrode plate, comprising: a negative current collector; a negative active material layer disposed on at least one surface of the negative current collector, the negative active material layer comprising opposite first surface and second surface, wherein the first surface is disposed away from the negative current collector; and an inorganic dielectric layer consisting of an inorganic dielectric material disposed on the first surface of the negative active material layer; the inorganic dielectric layer comprises a first dielectric layer on an outer surface of the negative active material layer, and the first dielectric layer has a thickness of from 30 nm to 1000 nm; wherein the negative electrode plate has a compact density of from 1.2 g/cm$^3$ to 2.0 g/cm$^3$, a porosity of from 25% to 45% and a wetting velocity of electrolyte on per 10 cm×10 cm area of 2 μg/s or more.

The second aspect of the application provides a method for preparation of a negative electrode plate comprising the steps of: disposing a negative active material layer on at least one surface of a negative current collector; depositing an inorganic dielectric material on a surface of the negative active material layer facing away from the negative current collector by vapor deposition, to obtain an inorganic dielectric layer including a first dielectric layer on an outer surface of the negative active material layer; the first dielectric layer has a thickness of from 30 nm to 1000 nm; wherein the negative electrode plate has a compact density of from 1.2 g/cm$^3$ to 2.0 g/cm$^3$, a porosity of from 25% to 45% and a wetting velocity of electrolyte on per 10 cm×10 cm area of 2 μg/s or more.

The third aspect of the application provides an electrochemical device, comprising a positive electrode plate, a negative electrode plate, a separator and an electrolyte, wherein the negative electrode plate is the negative electrode plate according to the first aspect of the application.

As compared with the existing prior art, the application has at least the following beneficial effects:

Due to the inorganic dielectric layer disposed between negative active material layer and separator and the negative electrode plate having a compact density of from 1.2 g/cm$^3$ to 2.0 g/cm$^3$, a porosity of from 25% to 45% and a wetting velocity of electrolyte on per 10 cm×10 cm area of 2 μs/s or more, the negative electrode plate provided by the application can stabilize negative electrode interface, and reduce side reactions between electrolyte and negative electrode interface, inhibit gas production, avoid an increase in irreversible capacity. The negative electrode plate of the application can also improve the kinetic performance of the electrochemical device, inhibit the precipitation of the reduced metal of electrolyte cation on the negative electrode, and avoid short circuit in electrochemical device. Therefore, the electrochemical device has simultaneously excellent safety performance and cycle performance, and the improved high temperature performance.

In addition, the negative electrode plate of the application can significantly inhibit the increase of Direct Current Resistance (DCR) during cycle and storage process of electrochemical device, thereby reducing thermal effects, reducing polarization, and improving rate performance.

DESCRIPTION OF THE DRAWINGS

In order to more clearly illustrate the technical solutions in the embodiments of the application, the figures used in the embodiments of the application will be briefly described below. A person skilled in the art can further obtained other drawings from these figures, without any creative work.

DETAILED DESCRIPTION

In order to make the object, technical solutions and beneficial technical effects of the present disclosure more apparent, hereinafter in combination with examples, the present disclosure is further described in detail. It should be understood that examples in the present disclosure are only to explain the present disclosure, and are not intended to limit the present disclosure.

For the sake of brevity, only certain ranges are explicitly disclosed herein. However, ranges from any lower limit may be combined with any upper limit to recite a range not explicitly recited; ranges from any lower limit may be combined with any other lower limit to recite a range not explicitly recited; and in the same way, ranges from any upper limit may be combined with any other upper limit to recite a range not explicitly recited. Additionally, within a range includes every point or individual value between its end points even though not explicitly recited. Thus, every point or individual value may serve as its own lower or upper limit combined with any other point or individual value or any other lower or upper limit, to recite a range not explicitly recited.

In the description herein, it is to be noted that unless otherwise stated, the words "above" and "below" are inclusive of the case where it is equal to, and the word "more" in fragment "one or more" means two or more.

The contents of the above disclosure are not intended to describe each and every example or embodiment disclosed herein. More exemplary embodiments will be described below in more details by way of examples. At a plurality of places throughout the present disclosure, a series of examples are provided to give teaching, and these examples can be combined in any way, if possible. In each example, the exemplification is just for illustrative purpose, and shall not be interpreted as enumeration.

Negative Electrode Plate

Figure 1:
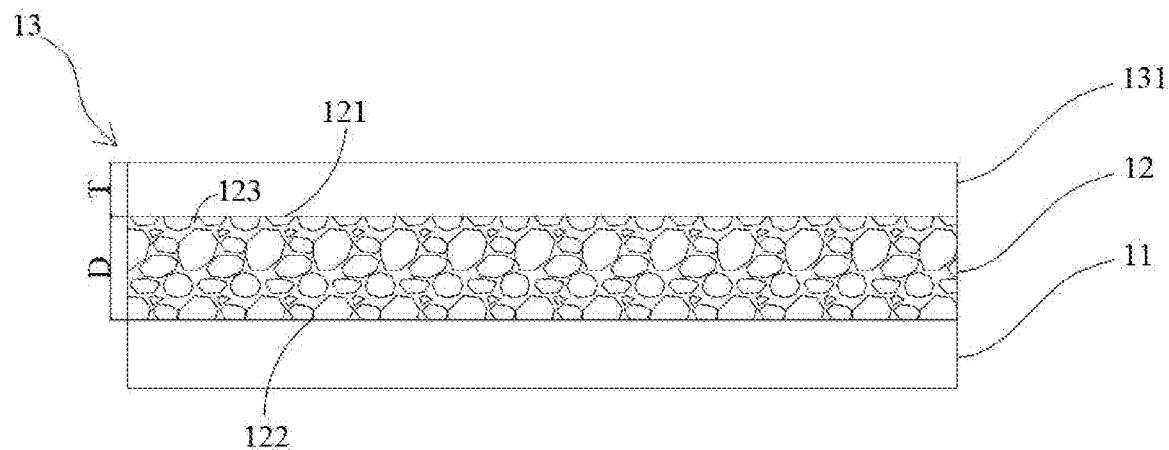
FIG. 1 shows a schematic view of the structure of a negative electrode plate provided by an embodiment of the application.
Figure 2:
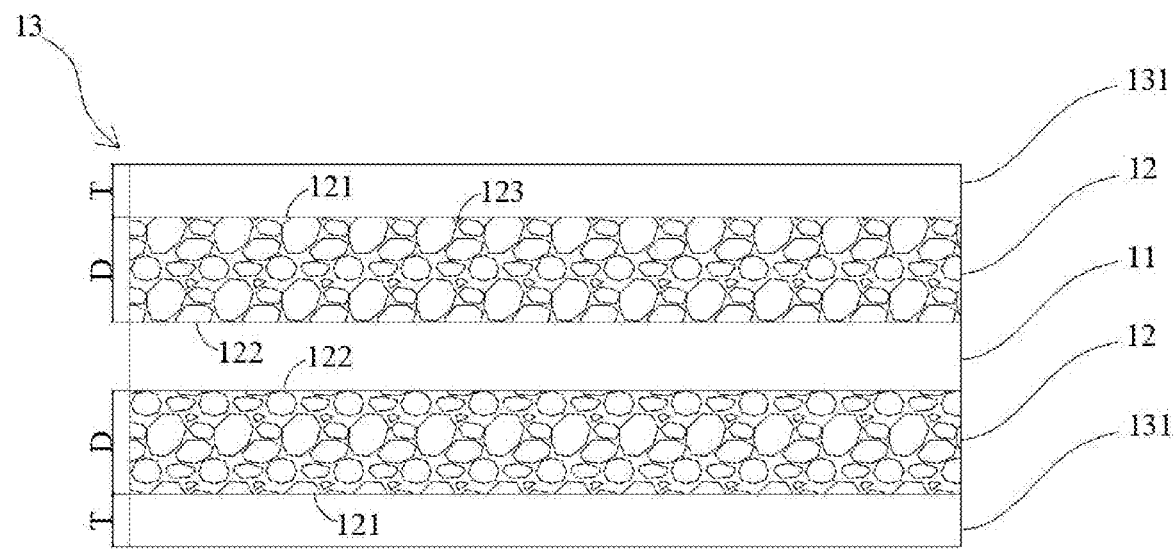
FIG. 2 shows a schematic view of the structure of a negative electrode plate provided by another embodiment of the application.

Referring to FIGS. 1 and 2, the first aspect of an embodiment of the application provides a negative electrode plate 10, comprising a negative current collector 11, a negative active material layer 12 and an inorganic dielectric layer 13 which are provided in a stacked manner.

The negative current collector 11 includes two opposite surfaces along its thickness direction. The negative active material layer 12 may be disposed on either one of the two surfaces (as shown in FIG. 1) or may be disposed on both of the two surfaces respectively (as shown in FIG. 2). The negative active material layer 12 includes opposite first surface 121 and second surface 122 along the thickness direction thereof, wherein the first surface 121 is disposed away from the negative current collector 11, and the second surface 122 is disposed toward the negative current collector 11. The negative active material layer 12 comprises negative active material, and has a large number of pores 123 therein. Reversible de-intercalation/intercalation of electrolyte cations may be carried out during operation. The negative current collector 11 is used for current collection and output.

The inorganic dielectric layer 13 is disposed on the first surface 121 of the negative active material layer 12 and consists of an inorganic dielectric material. The inorganic dielectric layer 13 comprises first dielectric layer 131 on outer surface of the negative active material layer 12. The first dielectric layer 131 has a thickness T of from 30 nm to 1000 nm. The first dielectric layer 131 has a porous structure inside, forming a large number of pores and channels. The first dielectric layer 131 has a large number of polar groups on the surface of the material, has good ion conductivity property, and is capable of transporting electrolyte cations.

Further, the negative electrode plate has a compact density of from 1.2 g/cm$^3$ to 2.0 g/cm$^3$, a porosity of from 25% to 45% and a wetting velocity of electrolyte on per 10 cm×10 cm area of 2 μg/s or more.

The compact density C of negative electrode plate 10 may be calculated by the equation $C=(m \times w)/(A_n \times \delta)$, wherein m is the mass of the negative active material layer, w is the mass fraction of the negative active material in the negative active material layer, $A_n$ is the area of the negative active material layer, and $\delta$ is the thickness of the negative active material layer.

The porosity of the negative electrode plate 10 may be measured by mercury intrusion method or gas adsorption method.

The wetting velocity of electrolyte on per 10 cm×10 cm area of the negative electrode plate 10 may be measured by the following procedure: uniformly mixing ethylene carbonate (EC), ethyl methyl carbonate (EMC) and diethyl carbonate (DEC) at a volume ratio of 20:20:60 to obtain an electrolyte for testing; filling a dropper having a certain diameter with a standard scale with the electrolyte, wherein the lower mouth of the dropper has a diameter of 1 mm; sufficiently drying the negative electrode plate (for example, drying at 70° C. for 12 h), and then cutting a square negative electrode plate of 10 cm×10 cm; In a dry room with a humidity of below 2%, placing the lower mouth of the dropper on the square negative electrode plate and ensuring that the dropper is perpendicular to a surface of the square negative electrode plate, so that the electrolyte in the dropper gradually wets into the inside of the square negative electrode plate; recording the mass of the electrolyte wetting into the square negative electrode plate per second, that is, the electrolyte infiltration rate per 10 cm×10 cm area of the negative electrode plate 10.

In the negative electrode plate 10 provided by an embodiment of the application, the inorganic dielectric layer 13 can insulate electrolyte and negative active material. In addition, due to its dielectric property, the inorganic dielectric layer 13 can achieve the effect of stabilizing the negative electrode interface, thereby greatly reducing the side reaction between the electrolyte and the negative electrode interface. Even under high temperature and fast charging conditions, it can also effectively control the side reaction between the electrolyte and the negative electrode interface, inhibit gas production, and effectively suppress the increase of irreversible capacity, thereby improving the safety performance, cycle performance and high temperature performance of electrochemical device. It results in an electrochemical device having high safety performance and cycle performance over a wide temperature range.

The negative electrode plate 10 provided by an embodiment of the application has high ion permeability and electron conductivities. In the case of charging and discharging at a high current, it can also facilitate the intercalation and de-intercalation of electrolyte cations to ensure good kinetic performance of electrochemical device. Therefore, the application can effectively control the problem of the precipitation of the reduced metal of the electrolyte cations on the surface of the negative electrode, avoid short circuit in electrochemical device, and further improve safety performance and cycle performance. Moreover, it is advantageous in reducing the interface resistance and improving the utilization of negative active material, thereby improving capacity and rate performance of the electrochemical device.

The negative electrode plate 10 provided by an embodiment of the application may also significantly inhibit the increase of Direct Current Resistance during cycle and storage of electrochemical device, thereby reducing thermal effects, reducing polarization, and improving capacity and rate performance.

Moreover, since the inorganic dielectric layer 13 does not contain any binder, the inorganic dielectric layer 13 is not bonded to the negative active material layer 12 by any binder, which helps to improve safety performance, cycle performance and high temperature performance of electrochemical device. It may prevent peeling off of the inorganic dielectric layer 13 from the surface of the negative active material layer 12, which may occur due to swelling and failure of binder during cycle and storage process.

In addition, since the thickness of the inorganic dielectric layer 13 is nanoscale, the volume and weight of negative electrode plate are barely changed, and the energy density of the electrochemical device is not lowered.

Therefore, the negative electrode plate provided by the application can provide an electrochemical device with excellent overall electrochemical performance.

Further, the thickness T of the first dielectric layer 131 may have an upper limit of 1000 nm, 990 nm, 950 nm, 900 nm, 850 nm, 800 nm, 750 nm, 720 nm, 700 nm, 680 nm, 650 nm, 600 nm, 550 nm, 500 nm, 490 nm, 450 nm, 430 nm, 400 nm, 380 nm, 350 nm, 300 nm, 280 nm, 250 nm, 200 nm; the thickness T may have a lower limit of 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 110 nm, 120 nm, 130 nm, 140 nm, 150 nm, 160 nm, 170 nm, 180 nm, 190 nm. The thickness T of the first dielectric layer 131 may be any value between the above upper and lower limits. The thickness T of the first dielectric layer 131 is preferably from 50 nm to 600 nm, more preferably from 100 nm to 500 nm, which may better exert the above effects of the inorganic dielectric layer 13 and may be advantageous for improving mass energy density and volume energy density of electrochemical device.

The ratio $C_r/T$ of reversible capacity $C_r$ per 1540 mm$^2$ area of the negative electrode plate 10 to the thickness T of the first dielectric layer 131 is preferably from 0.02 mAh/nm to 2 mAh/nm. This is advantageous in ensuring that the above effects of the inorganic dielectric layer 13 can be effectively exhibited when the negative electrode plate 10 is made of various negative active materials, thereby improving safety performance, cycle performance, and high temperature performance of electrochemical device.

Here, the reversible capacity $C_r$ per 1540 mm$^2$ area of the negative electrode plate 10 means the reversible capacity that is possessed by the negative electrode plate 10 per 1540 mm$^2$ area, and may be tested by the following procedure: cutting the negative electrode plate of 1540 mm$^2$ area, and preparing lithium metal piece having the same area as a counter electrode, assembling into a button type battery, and then performing the charging and discharging test to obtain the reversible capacity of the negative electrode plate of 1540 mm$^2$ area, i.e. the reversible capacity $C_r$ per 1540 mm$^2$ area of the negative electrode plate 10.

Figure 3A:
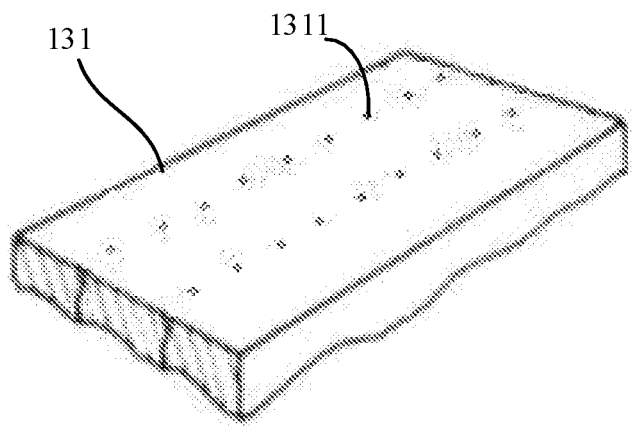
FIG. 3A shows a schematic view of a circular opening.
Figure 3B:
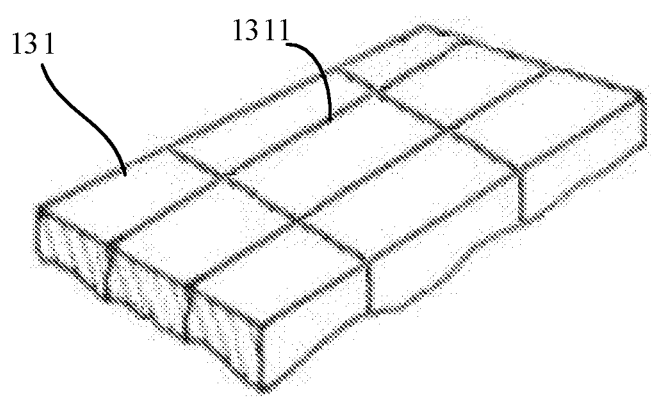
FIG. 3B shows a schematic view of a grooved opening.
Figure 3C:
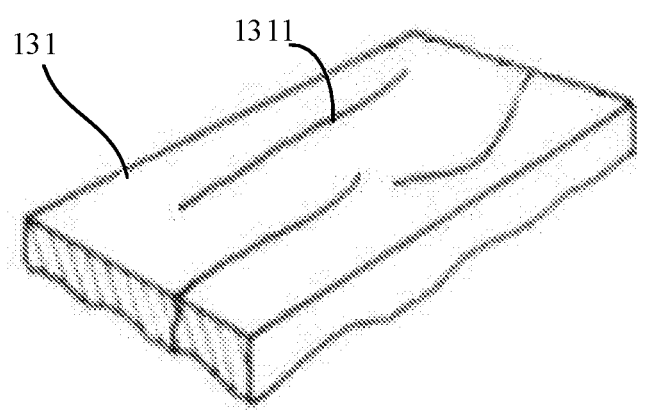
FIG. 3C shows a schematic view of crack opening.
Figure 4:
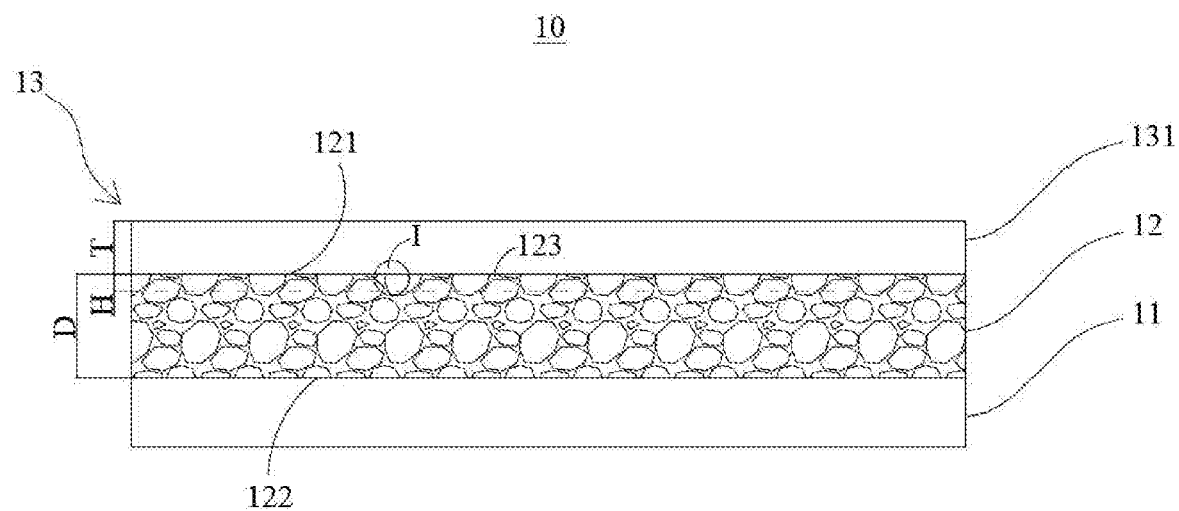
FIG. 4 shows a schematic view of the structure of a negative electrode plate provided by yet another embodiment of the application.
Figure 5:
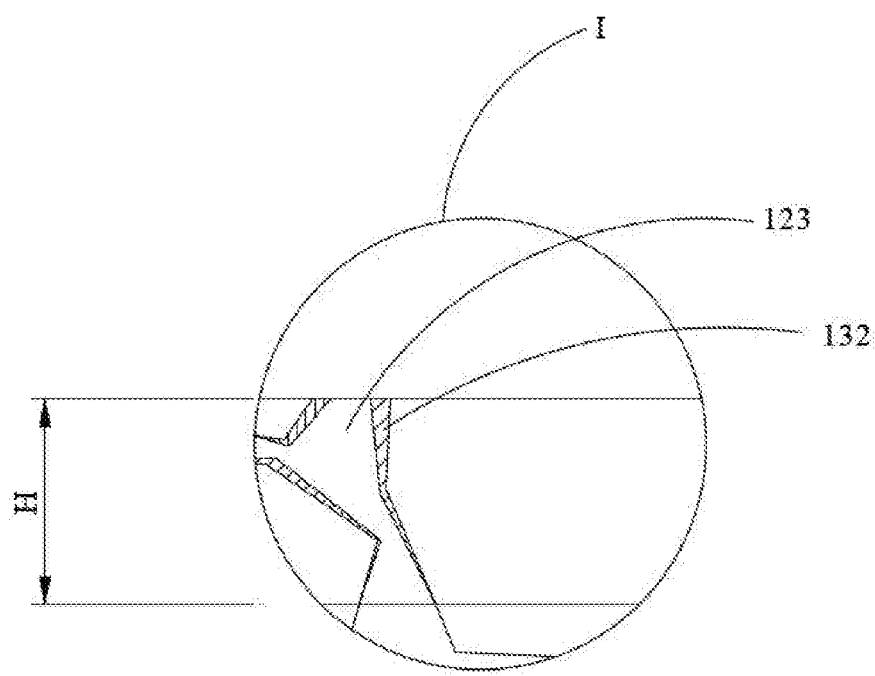
FIG. 5 is an enlarged view of area I of FIG. 4.
Figure 6:
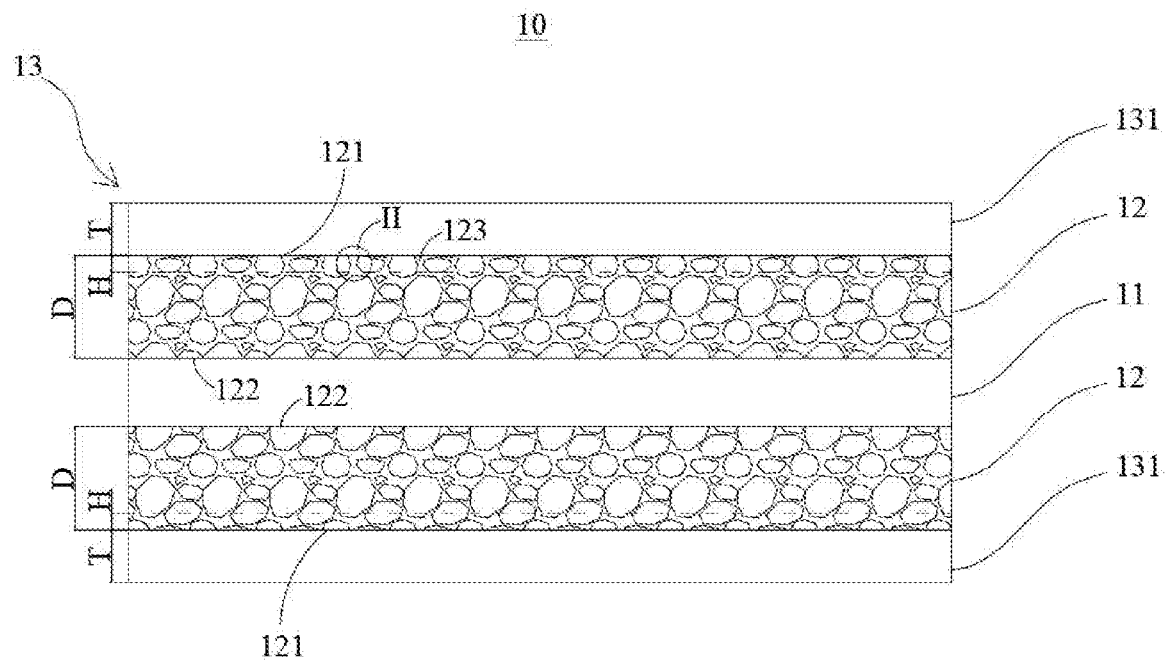
FIG. 6 shows a schematic view of the structure of a negative electrode plate provided by still another embodiment of the application.
Figure 7:
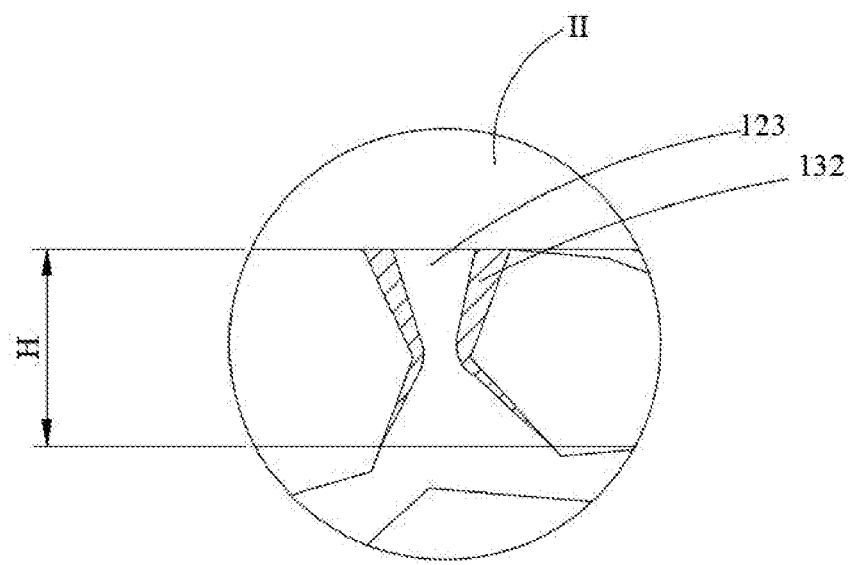
FIG. 7 is an enlarged view of area II of FIG. 6.

Further, referring to FIGS. 3A to 3C, the first dielectric layer 131 may also have an opening 1311. Specifically, the first dielectric layer 131 has two opposite surfaces along its thickness direction, and the opening 1311 extends through the two surfaces. This can provide an open channel and increase the contact area between the electrolyte and the surface of the electrode plate meanwhile stabilizing negative electrode interface and suppressing gas production, thereby further improving wetting and retention of electrolyte on the negative electrode plate and improving ion permeability of negative electrode plate. It may also improve the bonding between the inorganic dielectric layer 13 and the negative active material layer 12. When the negative active material layer 12 and the inorganic dielectric layer 13 are differently expand with varying degrees under conditions such as overcooling or overheating, it helps to release the stress of the inorganic dielectric layer 13, thereby preventing peeling off of the inorganic dielectric layer 13 from the negative active material layer 12. It is beneficial to improve the kinetic performance, rate performance and stability performance of the negative electrode plate 10.

The shape of the opening 1311 may be arbitrarily selected, for example, a through hole having a circular shape (as shown in FIG. 3A), an elliptical shape or a polygonal shape, a groove-like opening as shown in FIG. 3B, or a crack opening as shown in FIG. 3C.

It can be understood that although the arrangement of the openings 1311 in FIGS. 3A to 3C is relatively regular, in other embodiments, the arrangement of the openings 1311 may be arbitrary.

The opening 1311 may have a width of from 0.05 μm to 6 μm. Further, the opening 1311 has a width of from 0.5 μm to 6 μm, such as from 3 μm to 6 μm.

The first dielectric layer 131 has a coverage on the first surface 121 of the negative active material layer 12 of preferably from 70% to 95%, and more preferably from 80% to 90%, so that the negative electrode plate 10 has both high kinetic performance and high stability.

Further, referring to FIGS. 4 to 7, the inorganic dielectric layer 13 may also comprise second dielectric layer 132, disposed on inner wall of at least a portion of pores inside the negative active material layer 12, and the second dielectric layer extends on a direction from the first surface to the second surface of the negative active material layer 12. The second dielectric layer 132 has a porous structure inside, forming ion migration channels. This is beneficial to improve the stability of the negative electrode interface and reduce the side reaction between electrolyte and negative active material, thereby effectively suppressing the gas production of the electrochemical device. This may also improve wetting and retention of the electrolyte on the negative electrode plate 10, thereby further improving safety performance and cycle performance of electrochemical device, and improving the capacity and rate performance of the electrochemical device.

Preferably, the ratio H/D of the depth H of the second dielectric layer 132 extending on the direction from the first surface 121 to the second surface of the negative active material layer 12 to the thickness D of the negative active material layer 12 is from 1/1000 to 1/10. This is beneficial to improve the stability of the negative electrode interface, improve the wetting and retention of the electrolyte on the negative electrode plate 10 and meanwhile ensure the electrical conductivities of ions and electrons.

In some embodiments, the second dielectric layer 132 has a thickness d of $0 < d \leq 500$ nm, for example $10 \text{ nm} \leq d \leq 500$ nm, further for example $10 \text{ nm} \leq d \leq 100$ nm.

Preferably, the second dielectric layer 132 may have a thickness d showing a gradient decrease on a direction from the first surface 121 to the second surface 122. As a result, the inside of the negative electrode plate 10 has a relatively large pore diameter and a relatively high porosity, and the pore diameter and the porosity gradually decrease from the inside to the outside. The pore diameter is small and the porosity is low at the first surface 121. This is advantageous for improving the wetting and retention of the electrolyte on the negative electrode plate 10, thereby improving safety performance and cycle performance of electrochemical device.

The inorganic dielectric material in the inorganic dielectric layer 13 has an average particle diameter $D_v50$ of preferably from 1 nm to 10 nm, which is favorable for forming a channel for ion migration between material particles and improving ion conductivity property.

As an example, the above inorganic dielectric material may be one or more of compounds comprising an element A and an element B, wherein the element A may be one or more selected from the group consisting of Al, Si, Ti, Zn, Mg, Zr, Ca and Ba, and the element B may be one or more selected from the group consisting of O, N, F, Cl, Br and I. For example, an inorganic dielectric material may be one or more selected from the group consisting of oxide of aluminum, AlO(OH), nitride of aluminum, fluoride of aluminum, oxide of silicon, nitride of silicon, fluoride of silicon, oxide of titanium, nitride of titanium, fluoride of titanium, zinc oxide, zinc nitride, zinc fluoride, oxide of magnesium, nitride of magnesium, halide of magnesium, oxide of zirconium, nitride of zirconium, fluoride of zirconium, oxide of calcium, nitride of calcium, fluoride of calcium, oxide of barium, nitride of barium and fluoride of barium.

The thickness of the anode active material layer 12 is not particularly limited in the application, and may be adjusted by those skilled in the art according to actual needs. In some embodiments, the negative active material layer 12 may have a thickness of from 90 µm to 200 µm, for example from 100 µm to 130 µm.

The negative active material is not particularly limited in the application, and may be a negative active material which is known for capable of being intercalated by electrolyte cations in the art. In some embodiments, the negative active material may have an average particle diameter $D_v50$ of from 6 µm to 10 µm.

For example, in a negative electrode plate for a lithium ion battery, the negative active material may be one or more selected from the group consisting of natural graphite, artificial graphite, soft carbon, hard carbon, silicon, silicon oxides, silicon carbon composites, Li—Sn alloy, Li—Sn—O alloy, Sn, SnO, $SnO_2$, $Li_4Ti_5O_{12}$ with spinel structure, Li—Al alloy and lithium metal. Wherein, silicon oxides refer to $SiO_x$, x<2, for example silicon monoxide and the like; silicon carbon composites may be one or more selected from the group consisting of carbon-coated silicon, carbon-coated silicon oxide, a mixture of silicon and carbon, a mixture of silicon oxide and carbon, a mixture of silicon and silicon oxide and carbon, wherein the carbon may be one or more selected from the group consisting of graphite, soft carbon, and hard carbon.

In the negative electrode plate 10 of the application, the negative active material layer 12 may also optionally comprises a binder and a conductive agent. The types of the binder and the conductive agent are not particularly limited, and may be selected according to actual requirements. As an example, the binder may be one or more selected from the group consisting of styrene-butadiene rubber (SBR), water-based acrylic resin, carboxymethyl cellulose (CMC), polyvinylidene fluoride (PVDF), polytetrafluoroethylene (PTFE), polyvinyl butyral (PVB), ethylene-vinyl acetate copolymer (EVA), and polyvinyl alcohol (PVA). The conductive agent may be one or more selected from the group consisting of graphite, superconducting carbon, acetylene black, One or more of carbon black, ketjen black, carbon dots, carbon nanotubes, graphene, and carbon nanofibers.

In the negative electrode plate 10 of the application, the type of the negative current collector 11 is not particularly limited and may be selected according to actual requirements. For example, a material such as a metal foil, a carbon-coated metal foil or a porous metal plate may be used as a negative current collector, such as a copper foil.

An embodiment of the application further provides a method for the preparation of a negative electrode plate 10, comprising the step:

Step S100, disposing a negative active material layer on at least one surface of a negative current collector.

Step S100 may be carried out by the any of the following ways:

Dispersing a negative active material and optionally a binder and a conductive agent in a solvent, for example deionized water or N-methylpyrrolidone (NMP), to form a uniform negative electrode slurry; coating or spraying the negative electrode slurry on a surface of the negative current collector; and drying or the like, to form the negative active material layer on at least one surface of the negative current collector.

A negative active material layer may be obtained by direct preparing the negative active material on the negative current collector. For example, the negative active material may be directly prepared on the negative current collector by vapor deposition. Vapor deposition method may be one or more of Atomic Layer Deposition (ALD), Chemical Vapor Deposition (CVD), and Physical Vapor Deposition (PVD).

A lithium metal foil was prepared on the anode current collector to obtain a cathode active material layer. For example, a lithium metal foil is pressed onto the negative current collector.

A negative active material layer may be obtained by preparing a thin lithium metal sheet on the negative current collector. For example, a thin lithium metal sheet may be pressed on the negative current collector.

Step S200, disposing an inorganic dielectric layer on a surface of the negative active material layer facing away from the negative current collector by vapor deposition, to obtain a negative electrode plate.

Vapor deposition may be one or more selected from the group consisting of Atomic Layer Deposition (ALD), Chemical Vapor Deposition (CVD), and Physical Vapor Deposition (PVD). The physical vapor deposition method is preferably one or more selected from the group consisting of evaporation, sputtering, and Arc Ion Plating (ATP), for example, Thermal Evaporation Deposition, Plasma assisted Thermal Evaporation, Electron Beam Evaporation Method (EBEM), Plasma assisted electron beam Evaporation, Reactive Ion-beam Sputtering (RIBS), Magnetron sputtering, and Arc Ion Plating (ATP).

During vapor deposition, as the inorganic dielectric material is deposited on a surface of the negative active material layer to form a first dielectric layer, a second dielectric layer is simultaneously formed on inner wall of pores on a surface of the negative active material layer. As the thickness of the first dielectric layer is gradually increased, the second dielectric layer gradually extends toward the inside of the negative active material layer, and its thickness is gradually decreased from the outside to the inside.

The parameters such as composition, thickness and morphology of the first dielectric layer and the second dielectric layer may be modulated by adjusting the porosity and average pore diameter of the negative active material layer, the average particle diameter of the anode active material, and adjusting one or more of processing parameters including the type and concentration of reaction raw materials for vapor deposition and reaction temperature, surface temperature of the negative active material layer, deposition distance, deposition rate, and the deposition time, and the like.

In case the inorganic dielectric layer is prepared by thermal evaporation, step S200 may include the following steps:

Step S210, vacuum pumping a deposition chamber to a gas pressure of 0.1 Pa or less, such as 0.001 Pa or less.

Step S220, introducing a reactive gas a into the deposition chamber. The reactive gas a may be one or more selected from the group consisting of oxygen, ozone, carbon dioxide, water vapor, nitrogen, nitrogen monoxide, nitrogen dioxide, and ammonia.

Step S230, heating an inorganic dielectric material precursor b into a gaseous state in a heating chamber, and introducing it into the deposition chamber. The inorganic dielectric material precursor b may be one or more selected from the group consisting of a simple substance, an alloy, an alkyl compound, a nitrate, an acetate, and a sulfate containing the element A.

Step S240, reacting the reactive gas a with the precursor of the gaseous inorganic dielectric material by adjusting the concentration of the inorganic dielectric material precursor b in a gaseous state in the deposition chamber, the temperature in the chamber, deposition distance, deposition time and the like, to form an inorganic dielectric layer on a surface of the negative active material layer.

In case the inorganic dielectric layer is prepared by plasma assisted electron beam evaporation, step S200 may include the following steps:

Step S210', vacuum pumping a reaction chamber to a gas pressure of 0.1 Pa or less, such as 0.001 Pa or less.

Step S220', introducing the reactive gas a into the inductively coupled plasma (ICP) source. The reactive gas a may be diluted with an inert gas. Under the action of the ICP source, the reactive gas a generates a plasma containing element B.

Here, the reactive gas a is as described above. The inert gas may be, for example, one or more selected from the group consisting of argon gas, nitrogen gas, and helium gas.

The ICP source may have a power of from 300 W to 600 W. The reactive gas a may have a flow rate of from 200 sccm to 500 sccm.

Step S230', in the reaction chamber, bombarding a target c containing element A with an electron beam generated by an electron gun, to melt and evaporate the target c; chemically reacting the resulting gaseous material with the plasma and depositing it on a surface of the negative active material layer to form an inorganic dielectric layer.

Herein, the target c containing element A may be one or more selected from the group consisting of a simple substance and an alloy containing element A.

The electron beam may have a voltage of from 6 kV to 12 kV. Furthermore, temperature of the negative active material layer is preferably controlled in a range of 100° C. or less.

The parameters such as composition of the inorganic dielectric layer, and its thickness, morphology and the like on the negative active material layer may be modulated by adjusting one or more of the parameters including vacuum degree in the reaction chamber, voltage of the electron beam, composition and flow rate of the reactive gas a, composition of the target c containing element A, ICP source, surface temperature of the negative active material layer, and the process time.

Last, subjecting the initial negative electrode plate deposited with an inorganic dielectric layer to trimming, cutting, and slitting, and then drying under vacuum condition at 85° C. for 4 hours, thereby obtaining a negative electrode plate.

In step S100, after disposing the negative active material on at least one surface of the negative current collector, cold pressing treatment may be performed to obtain a negative active material layer having a predetermined compact density and porosity. No cold pressing treatment is performed to a primary product of negative electrode plate. The resulting first dielectric layer in the inorganic dielectric layer has a continuous layered structure.

Certainly, in step S100, after disposing the negative active material on at least one surface of the negative current collector, cold pressure treatment may not be performed. Instead, the inorganic dielectric material is deposited first, and then the negative electrode plate is cold pressed. This results in a negative electrode plate having a predetermined compact density and porosity while forming a crack opening in the first dielectric layer having a discontinuous layered structure, so that the negative electrode plate has more ion channels and larger surface area, which is beneficial to ensure good kinetic performance and rate performance of electrochemical device.

According to the method for the preparation of the negative electrode plate 10 described in the embodiment of the application, the above-described negative electrode plate 10 of the application be obtained, so that the resulting electrochemical device has excellent safety performance and cycle performance, and meanwhile has the improved kinetic performance, rate performance and high temperature performance of electrochemical device.

Electrochemical Device

The second aspect of the embodiment of the application provides an electrochemical device. The electrochemical device may be, but not limited thereto, a lithium ion secondary battery, a lithium primary battery, a sodium ion battery, or a magnesium ion battery.

The electrochemical device comprises a positive electrode plate, a negative electrode plate, a separator, and an electrolyte, wherein the negative electrode plate is the negative electrode plate provided by the first aspect of the embodiment of the application.

By using the negative electrode plate of the first aspect of the embodiment of the application, the electrochemical device has excellent safety performance and cycle performance, and meanwhile has the improved rate performance and high temperature performance of the electrochemical device.

Hereinafter, an electrochemical device will be further described by taking a lithium ion secondary battery as an example.

In a lithium ion secondary battery, a positive electrode plate may comprise a positive current collector and a positive active material layer disposed on at least one surface of the positive current collector.

The positive current collector may be a metal foil, a carbon-coated metal foil or a porous metal plate, for example an aluminum foil.

The thickness of the positive active material layer is not particularly limited in the application and may be adjusted by those skilled in the art according to actual needs. In some embodiments, the positive active material layer may have a thickness of from 100 μm to 180 μm, for example from 110 μm to 130 μm.

The positive active material in the positive active material layer is not particularly limited, as long as it is a compound capable of reversibly intercalating/de-intercalating lithium ions. For example, the positive active material may be a lithium transition metal composite oxide, wherein the transition metal may be one or more selected from the group consisting of Mn, Fe, Ni, Co, Cr, Ti, Zn, V, Al, Zr, Ce and Mg. The lithium transition metal composite oxide may be, for example, one or more selected from the group consisting of $LiMn_2O_4$, $LiNiO_2$, $LiCoO_2$, $LiNi_{1-y}Co_yO_2$ ($0<y<1$), $LiNi_aCo_bAl_{1-a-b}O_2$ ($0<a<1$, $0<b<1$, $0<a+b<1$), $LiMn_{1-m-n}Ni_mCo_nO_2$ ($0<m<1$, $0<n<1$, $0<m+n<1$), $LiMPO_4$ (M may be one or more of Fe, Mn, and Co) and $Li_3V_2(PO_4)_3$. In the lithium transition metal composite oxide, an element having a large electronegativity, such as one or more of S, N, F, Br, Cl, and I, may also be doped. The lithium transition metal composite oxide may also be subjected to a coating modification treatment. The doping and/or coating modification enables the compound to have more stable structure and better electrochemical performance.

The positive active material layer may comprise a binder and a conductive agent. The above binder is not particularly limited, and may be for example one or more selected from the group consisting of styrene-butadiene rubber (SBR), water-based acrylic resin, carboxymethyl cellulose (CMC), polyvinylidene fluoride (PVDF), polytetrafluoroethylene (PTFE), polyvinyl butyral (PVB), ethylene-vinyl acetate copolymer (EVA), and polyvinyl alcohol (PVA). The above conductive agent is not particularly limited, and may be for example one or more selected from the group consisting of graphite, superconducting carbon, acetylene black, carbon black, ketjen black, carbon dots, carbon nanotubes, graphene, and carbon nanofibers.

The positive electrode plate may be prepared by conventional method in the art. Usually, a positive electrode active material and a conductive agent and a binder are dispersed in a solvent (for example, N-methylpyrrolidone, abbreviated as NMP), to form a uniform positive electrode slurry. The positive electrode slurry is coated on the positive current collector. After the steps of drying, cold pressing, etc., the positive electrode plate is obtained.

The separator in lithium ion secondary battery is not particularly limited, and be any well-known porous structural separator having electrochemical stability and chemical stability. For example, a single or multilayer film of one or more selected from the group consisting of glass fiber, nonwoven fabric, polyethylene, polypropylene, and polyvinylidene fluoride may be used.

The electrolyte in lithium ion secondary battery comprises an organic solvent and an electrolyte lithium salt.

The above organic solvent is not particularly limited, and may be selected according to actual requirements. For example, the organic solvent may be one or more, preferably two or more, selected from the group consisting of ethylene carbonate (EC), propylene carbonate (PC), ethyl methyl carbonate (EMC), diethyl carbonate (DEC), dimethyl carbonate (DMC), dipropyl carbonate (DPC), methyl propyl carbonate (MPC), ethylpropyl carbonate (EPC), butylene carbonate (BC), fluorinated ethyl carbonate (FEC), methyl formate (MF), methyl acetate (MA), ethyl acetate (EA), propyl acetate (PA), methyl propionate (MP), ethyl propionate (EP), propyl propionate (PP), methyl butyrate (MB), ethyl butyrate (EB), 1,4-butyrolactone (GBL), sulfolane (SF), dimethyl sulfone (MSM), methyl ethyl sulfone (EMS), and diethyl sulfone (ESE).

The type of the above electrolyte lithium salt is not particularly limited, and may be selected according to actual requirements. For example, the electrolyte lithium salt may be one or more selected from the group consisting of $LiPF_6$ (lithium hexafluorophosphate), $LiBF_4$ (lithium tetrafluoroborate), $LiClO_4$ (lithium perchlorate), $LiAsF_6$ (lithium hexafluoroarsenate), LiFSI (lithium bis(fluorosulfonyl)imide), LiTFSI (lithium bis(trifluoromethanesulphonyl)imide), LiTFS (lithium trifluoromethanesulfonate), LiDFOB (lithium difluorooxalate borate), LiBOB (lithium bis(oxalate)borate), $LiPO_2F_2$ (lithium difluorophosphate), LiDFOP (lithium difluorodioxalate phosphate) and LiTFOP (lithium tetrafluorooxalate phosphate). Preferably, the electrolyte lithium salt in electrolyte has a concentration of from 0.5 mol/L to 1.5 mol/L, further preferably from 0.8 mol/L to 1.2 mol/L.

The electrolyte may further optionally comprise additives. The type of the additive is not particularly limited and may be selected according to actual requirements. For example, the additives may be one or more selected from the group consisting of vinylene carbonate (VC), vinyl ethylene carbonate (VEC), fluoroethylene carbonate (FEC), succinonitrile (SN), adiponitrile (ADN), 1,3-propene sultone (PST), tris(trimethylsilyl)phosphate (TMSP) and tris(trimethylsilyl)borate (TMSB).

The above electrolyte may be prepared in accordance with a conventional method in the art. An electrolyte may be obtained by uniformly mixing an organic solvent and an electrolyte lithium salt and optional additive. Here, the sequence in which the materials are added is not particularly limited. For example, an electrolyte may be obtained by adding an electrolyte lithium salt and optional additive into an organic solvent and uniformly mixing. Here, the electrolyte lithium salt may be first added to the organic solvent, and then the optional additive may be separately or simultaneously added to the organic solvent.

The above positive electrode plate, separator and negative electrode plate are stacked in order, so that the separator is placed between the positive electrode plate and the negative electrode plate to take a function of isolating, thereby obtaining a battery core. A battery core may also be obtained after winding. The battery core is placed in a package. After injection of an electrolyte, the package is sealed to prepare a lithium ion secondary battery.

EXAMPLES

The present disclosure is more particularly described in the following examples that are intended as illustrations only, since numerous modifications and variations within the scope of the present disclosure will be apparent to those skilled in the art. Unless otherwise noted, all parts, percentages, and ratios reported in the following examples are on a weight basis, and all reagents used in the examples are commercially available and used directly without further treatment, and the instruments used in the examples are commercially available.

Example 1

Preparation of Negative Electrode Plate

Step S110, mixing and adding a negative active material, a conductive agent acetylene black, a binder styrene-butadiene rubber (SBR), a thickener sodium carboxymethyl cellulose (CMC) into a solvent deionized water at a mass ratio of 96:1:2:1. After stirring and mixing uniformly, a negative electrode slurry was obtained. Here, the negative active material was artificial graphite.

Step S120, uniformly coating the above negative electrode slurry on both surfaces of a negative current collector copper foil, and then drying at 80° C. to 90° C., followed by cold pressing, to obtain a negative active material coating.

Step S200, preparing an inorganic dielectric layer on a surface of the negative active material coating by using a plasma-assisted electron beam evaporation method. This step specifically included:

Step S210', vacuum pumping a reaction chamber to a gas pressure of 0.001 Pa or less.

Step S220', introducing oxygen into an ICP source, to generate oxygen plasma under the action of the ICP source. Here, the ICP source had a power of 300 W. The flow rate of oxygen was 300 sccm.

Step S230', in the reaction chamber, bombarding an aluminum target c with an electron beam, so that it was heated to from 600° C. to 650° C. to melt and evaporate. Aluminum vapor chemically reacted with oxygen plasma and were deposited on a surface of the negative active material coating, wherein the temperature of the negative active material coating was controlled in a range of 100° C. or less, to form an inorganic dielectric layer. The first dielectric layer in the inorganic dielectric layer had a continuous layered structure and a thickness T of 30 nm.

Step S300, further performing cold pressing, trimming, cutting, slitting, and finally drying under vacuum condition at 85° C. for 4 hours, thereby obtaining a negative electrode plate. The negative electrode plate had a compact density of from 1.7 g/cm³, a porosity of 35%. The negative active material layer had a thickness of 101 μm.

Preparation of Positive Electrode Plate

A ternary material $LiNi_{0.8}Co_{0.1}Mn_{0.1}O_2$, conductive carbon black (SP), and a binder polyvinylidene fluoride (PVDF) were mixed at a weight ratio of 96:2:2 and added into a solvent N-methylpyrrolidone (NMP). After thoroughly stirring and mixing, a uniform positive electrode slurry was formed. The positive electrode slurry was coated on a positive current collector aluminum foil, and then dried at 85° C., followed by cold pressing, trimming, cutting, and slitting, and then dried under vacuum at 85° C. for 4 h to obtain a positive electrode plate. The thickness of positive active material layer in the positive electrode plate was 119

Preparation of Electrolyte

Ethylene carbonate (EC), ethyl methyl carbonate (EMC), and diethyl carbonate (DEC) were uniformly mixed at a volume ratio of 20:20:60 to obtain an organic solvent. In an argon atmosphere glove box having a water content of less than 10 ppm, 1 mol/L of $LiPF_6$ was dissolved in the above organic solvent and uniformly mixed to obtain an electrolyte.

Preparation of Lithium Ion Secondary Battery

The positive electrode plate, the separator, and the negative electrode plate were stacked in order. A polyethylene (PE) film with a thickness of 14 μm was used as a separator, and placed between the positive electrode plate and the negative electrode plate to take a function of isolating. Then the stack was wound into a bare battery core. After welding, the bare battery core was packed into aluminum foil casing, followed by baking at 80° C. to remove water. After injection of electrolyte, the package was sealed. A flexible lithium ion secondary battery was obtained after standing, chemical treatment (charged to 3.3 V with a constant current of 0.02 C and then charged to 3.6 V with a constant current of 0.1 C), shaping, capacity test, and the like. The flexible lithium ion secondary battery had a thickness of 4.0 mm and a width of 60 mm and a length of 140 mm.

Examples 2 to 7

Different from Example 1, some relevant parameters in the preparation steps of the negative electrode plate were adjusted.

Examples 8 to 15

Different from Example 1, no cold pressing treatment was performed in step S120; in step S300, first cold pressing, then trimming, cutting, slitting, and drying were performed and in the obtained a negative electrode plate, first dielectric layer has a discontinuous layered structure having a crack opening; and some relevant parameters in the preparation steps of the negative electrode plate were adjusted.

Examples 16 to 18

Different from Example 1, some relevant parameters in the preparation steps of the negative electrode plate were adjusted.

Comparative Examples 1 to 4

Different from Example 1, no inorganic dielectric layer was provided and step S200 was omitted; no cold pressing treatment was performed in step S120; and in step S300, first cold pressing, then trimming, cutting, slitting, and drying were performed.

Comparative Examples 5 to 7

Different from Example 1, some relevant parameters in the preparation steps of the negative electrode plate were adjusted.

Comparative Example 8

Different from Example 1, in step S200, an inorganic dielectric layer was prepared on a surface of a negative active material coating by a coating method; and some relevant parameters in the preparation steps of the negative electrode plate were adjusted.

Step S200 specifically included: mixing alumina particles with a binder to obtain a mixed slurry, wherein the binder was hydroxymethyl cellulose (CMC) present in an amount of 30% by weight; Applying the mixed slurry to a surface of the negative active material layer facing away from the negative current collector, followed by drying, to obtain an inorganic dielectric layer.

The relevant parameters of Examples 1 to 18 and Comparative Examples 1 to 8 were detailed in Table 1 below.

Tests (1) Test on Gas Production During High-Temperature Storage of Lithium Ion Secondary Battery At 25° C., each of the lithium ion secondary batteries prepared in Examples and Comparative Examples were charged at a constant current of 0.5 C to a voltage of 4.2 V, and then charged at a constant voltage of 4.2 V until the current was 0.05 C. At this moment, the initial volume of the secondary battery was measured and recorded as $V_0$. Then, the lithium ion secondary battery was placed in a thermostatic oven at 80° C. for 360 hours. After the completion of storage, the battery was taken out. The volume of the lithium ion secondary battery was measured and recorded as $V_1$. For each group, 15 lithium ion secondary batteries were tested and the values were averaged. In this test, the volume of the lithium ion secondary battery was tested using the water displacement method.

The volume expansion ratio (%) of the lithium ion secondary battery after storage at 80° C. for 360 hours=$(V_1-V_0)/V_0 \times 100\%$ (2) Test on Cycle Performance at High Temperature of Lithium Ion Battery At 45° C., each of the lithium ion secondary batteries prepared in Examples and Comparative Examples were charged at a constant current of 1 C to a voltage of 4.2 V, and charged at a constant voltage of 4.2 V until the current was 0.05 C, and then discharged at a constant current of 1 C to a voltage of 2.8 V. This was a charge/discharge cycle. The discharge capacity of at this time was the discharge capacity at the first cycle. The lithium ion secondary battery was subjected to 1000 charge/discharge cycles in accordance with the above method. Discharge capacity in each cycle was recorded. For each group, 15 lithium ion secondary batteries were tested and the values were averaged.

The capacity retention ratio (%) of the lithium ion secondary battery after 1000 1 C/1 C cycles at 45° C.=discharge capacity at the 1000th cycle/discharge capacity at the first cycle×100%.

(3) Test on Storage Performance at High Temperature of Lithium Ion Secondary Battery At 25° C., each of the lithium ion secondary batteries prepared in Examples and Comparative Examples were charged at a constant current of 0.5 C to a voltage of 4.2 V, and charged at a constant voltage of 4.2 V until the current was 0.05 C, and then discharged at a constant current of 1 C to a voltage of 2.8 V. The initial discharge capacity Co was obtained. The lithium ion secondary battery was charged at a constant current of 0.5 C to a voltage of 4.2V, and then charged at a constant voltage of 4.2V until the current was 0.05 C. The fully charged lithium ion secondary battery was placed in a thermostatic oven at 60° C. for 180 days. After being taking out of thermostatic oven, the reversible capacity of the lithium ion secondary battery was measured, and recorded as $C_{180}$. For each group, 15 lithium ion secondary batteries were tested and the values were averaged.

The capacity retention ratio (%) of the lithium ion secondary battery after storage at 60° C. for 180 days=$C_{180}/C_0 \times 100\%$.

(4) Test on Direct Current Resistance (DCR) Growth of Lithium Ion Battery after 1000 Cycles at High Temperature and Storage Performance at High Temperature for 180 Days At 25° C., first, each of fresh lithium ion secondary batteries prepared in Examples and Comparative Examples were charged at a constant current of 1 C to a voltage of 4.2 V, and charged at a constant voltage of 4.2 V until the current was 0.05 C, and then discharged at a constant current of 1 C to a voltage of 2.8 V. The actual discharge capacity was recorded. With the actual discharge capacity, the state of charge (SOC) of the lithium ion secondary battery was adjusted to 20% of the full charge capacity. After the completion of the adjustment, the voltage of the lithium ion secondary battery at this moment was measured and recorded as $U_1$. Then the lithium ion secondary battery was discharged at a rate of 0.3 C for 10 s. The voltage after discharge of the lithium ion secondary battery was measured and recorded as $U_2$.

The initial Direct Current Resistance $DCR_0$ of lithium ion secondary battery=$(U_1-U_2)/I$.

The Direct Current Resistance $DCR_1$ of the lithium ion secondary battery after 1000 cycles at 45° C. was tested according to the above method. The DCR growth of the lithium ion secondary battery was calculated. For each group, 15 lithium ion secondary batteries were tested and the values were averaged.

DCR growth (%) of the lithium ion secondary battery after 1000 1 C/1 C cycles at 45° C.=$(DCR_1-DCR_0)/DCR_0 \times 100\%$.

Similarly, the Direct Current Resistance $DCR_{180}$ of the lithium ion secondary battery after storage at 60° C. for 180 days was tested in accordance with the above method. The DCR growth of the lithium ion secondary battery was calculated. For each group, 15 lithium ion secondary batteries were tested and the values were averaged.

The DCR growth (%) of the lithium ion secondary battery after storage at 60° C. for 180 days=$(DCR_{180}-DCR_0)/DCR_0 \times 100\%$.

(5) Test on Lithium Precipitation on Surface of Negative Electrode Under High-Current Charging of Lithium Ion Secondary Battery At 25° C., first, each of fresh lithium ion secondary batteries prepared in Examples and Comparative Examples were charged at a constant current of 2 C to a voltage of 4.2 V, and charged at a constant voltage of 4.2 V until the current was 0.05 C, and then discharged at a constant current of 2 C to a voltage of 2.8 V. This was a charge/discharge cycle. The lithium ion secondary battery was subjected to 10 high-current charge/discharge cycles, and then charged at a constant current of 2 C to a voltage of 4.2 V, and charged at a constant voltage of 4.2 V until the current was 0.05 C.

The battery was fully charged and disassembled. The negative electrode plate was taken. The precipitation of lithium on the negative electrode plate was observed and classified according to the following scale: A, no lithium precipitation; B, slight lithium precipitation; C, a localized region formed by lithium; D, lithium residue in most regions; E, severe lithium precipitation.

The test results of Examples 1 to 18 and Comparative Examples 1 to 8 were shown in Table 2 below.

TABLE 1

| | Negative active material | Inorganic dielectric layer | | | | Negative electrode plate | | | |
|---|---|---|---|---|---|---|---|---|---|
| | | Inorganic dielectric material | T nm | Morphology of first dielectric layer | Width of crack μm | Compact density g/cm³ | Porosity % | wetting velocity of electrolyte μg/s | $C_r/T$ mAh/nm |
| Example 1 | artificial graphite | alumina | 30 | continuous layer | / | 1.7 | 35 | 2.2 | 1.33 |
| Example 2 | artificial graphite | alumina | 50 | continuous layer | / | 1.7 | 35 | 2.2 | 0.80 |
| Example 3 | artificial graphite | alumina | 100 | continuous layer | / | 1.7 | 35 | 2.2 | 0.40 |
| Example 4 | artificial graphite | alumina | 200 | continuous layer | / | 1.7 | 35 | 2.2 | 0.20 |
| Example 5 | artificial graphite | alumina | 500 | continuous layer | / | 1.7 | 35 | 2.1 | 0.08 |
| Example 6 | artificial graphite | alumina | 600 | continuous layer | / | 1.7 | 35 | 2.1 | 0.07 |
| Example 7 | artificial graphite | alumina | 1000 | continuous layer | / | 1.7 | 35 | 2.0 | 0.04 |

TABLE 1-continued

| | Negative active material | Inorganic dielectric layer | | | | Negative electrode plate | | | |
|---|---|---|---|---|---|---|---|---|---|
| | | Inorganic dielectric material | T nm | Morphology of first dielectric layer | Width of crack μm | Compact density g/cm³ | Porosity % | wetting velocity of electrolyte μg/s | $C_v/T$ mAh/nm |
| Example 8 | artificial graphite | alumina | 200 | discontinuous layer | 2.1 | 1.7 | 35 | 2.4 | 0.20 |
| Example 9 | artificial graphite | alumina | 200 | discontinuous layer | 2.3 | 1.4 | 45 | 2.6 | 0.20 |
| Example 10 | artificial graphite | alumina | 200 | discontinuous layer | 2.4 | 1.8 | 25 | 2.1 | 0.20 |
| Example 11 | artificial graphite | alumina + silicon nitride | 200 | discontinuous layer | 2.3 | 1.7 | 35 | 2.2 | 0.20 |
| Example 12 | artificial graphite | alumina + silicon oxide | 200 | discontinuous layer | 2.3 | 1.7 | 35 | 2.2 | 0.20 |
| Example 13 | artificial graphite + natural graphite | alumina | 200 | discontinuous layer | 2.3 | 1.7 | 35 | 2.3 | 0.20 |
| Example 14 | silicon oxide + artificial graphite | alumina | 200 | discontinuous layer | 2.3 | 1.7 | 40 | 2.2 | 0.30 |
| Example 15 | silicon oxide | alumina | 200 | discontinuous layer | 2.4 | 1.7 | 30 | 2.4 | 0.40 |
| Example 16 | artificial graphite + natural graphite | alumina | 200 | continuous layer | / | 1.7 | 35 | 2.2 | 0.20 |
| Example 17 | silicon oxide + artificial graphite | alumina | 200 | continuous layer | / | 1.7 | 34 | 2.2 | 0.30 |
| Example 18 | silicon oxide | alumina | 200 | continuous layer | / | 1.7 | 35 | 2.2 | 0.40 |
| Comparative Example 1 | artificial graphite | / | / | / | / | 1.7 | 35 | 1.7 | / |
| Comparative Example 2 | artificial graphite + natural graphite | / | / | / | / | 1.7 | 40 | 1.6 | / |
| Comparative Example 3 | silicon oxide + artificial graphite | / | / | / | / | 1.7 | 30 | 1.8 | / |
| Comparative Example 4 | silicon oxide | / | / | / | / | 1.7 | 30 | 1.7 | / |
| Comparative Example 5 | artificial graphite | alumina | 20 | continuous layer | / | 1.7 | 35 | 2.2 | 2.00 |
| Comparative Example 6 | artificial graphite | alumina | 1200 | continuous layer | / | 1.7 | 35 | 2.1 | 0.03 |
| Comparative Example 7 | artificial graphite | alumina | 200 | continuous layer | / | 1.2 | 35 | 1.7 | 0.20 |
| Comparative Example 8 | artificial graphite | alumina | 2000 | continuous layer | / | 1.75 | 32 | 1.7 | 0.02 |

TABLE 2

| | Volume expansion ratio after storage at 80° C. for 360 hours/% | Capacity retention ratio after 1000 cycles at 45° C./% | DCR growth after 1000 cycles at 45° C./% | Capacity retention ratio after storage at 60° C. for 180 days/% | DCR growth after storage at 60° C. for 180 days/% | Lithium precipitation on surface of negative electrode under high-current charging |
|---|---|---|---|---|---|---|
| Example 1 | 22.5 | 84.6 | 32.4 | 85.4 | 33.1 | A |
| Example 2 | 17.6 | 85.2 | 27.8 | 86.7 | 32.4 | A |
| Example 3 | 15.7 | 87.3 | 22.0 | 87.1 | 25.7 | A |
| Example 4 | 17.3 | 86.7 | 25.3 | 86.3 | 25.3 | A |
| Example 5 | 16.8 | 88.9 | 26.2 | 85.5 | 26.9 | B |
| Example 6 | 19.9 | 85.3 | 22.6 | 83.7 | 27.1 | B |
| Example 7 | 22.7 | 82.5 | 24.7 | 84.7 | 28.4 | C |
| Example 8 | 17.5 | 88.0 | 25.4 | 84.6 | 25.4 | A |
| Example 9 | 17.9 | 89.6 | 24.3 | 86.3 | 24.4 | A |
| Example 10 | 18.4 | 88.4 | 25.9 | 85.4 | 22.2 | A |
| Example 11 | 18.4 | 82.1 | 24.5 | 86.3 | 23.3 | A |
| Example 12 | 21.9 | 83.1 | 24.1 | 87.4 | 22.7 | A |
| Example 13 | 22.7 | 84.2 | 24.2 | 86.5 | 24.0 | A |
| Example 14 | 18.6 | 82.3 | 22.7 | 84.2 | 23.4 | A |
| Example 15 | 42.5 | 85.2 | 24.8 | 86.4 | 26.1 | A |
| Example 16 | 23.1 | 81.6 | 26.39 | 81.6 | 27.77 | B |
| Example 17 | 24.3 | 78.2 | 25.26 | 78.2 | 28.01 | B |
| Example 18 | 25.6 | 77.2 | 26.71 | 77.2 | 29.25 | B |
| Comparative Example 1 | 30.8 | 75.3 | 34.9 | 76.0 | 38.2 | A |
| Comparative Example 2 | 29.1 | 75.3 | 36.1 | 77.9 | 36.3 | B |

TABLE 2-continued

|  | Volume expansion ratio after storage at 80° C. for 360 hours/% | Capacity retention ratio after 1000 cycles at 45° C./% | DCR growth after 1000 cycles at 45° C./% | Capacity retention ratio after storage at 60° C. for 180 days/% | DCR growth after storage at 60° C. for 180 days/% | Lithium precipitation on surface of negative electrode under high-current charging |
|---|---|---|---|---|---|---|
| Comparative Example 3 | 32.6 | 74.4 | 37.0 | 74.5 | 36.0 | B |
| Comparative Example 4 | 46.5 | 70.3 | 54.3 | 72.9 | 49.4 | B |
| Comparative Example 5 | 34.5 | 75.4 | 32.3 | 79.4 | 35.6 | B |
| Comparative Example 6 | 30.4 | 74.5 | 33.1 | 75.4 | 32.1 | E |
| Comparative Example 7 | 36.5 | 73.4 | 36.3 | 75.4 | 35.6 | D |
| Comparative Example 8 | 30.4 | 74.5 | 33.1 | 75.4 | 32.1 | E |

From the comparisons of test results between Comparative Examples 1 to 12 and Comparative Example 1, Examples 13 and 16 and Comparative Example 2, Examples 14 and 17 and Comparative Example 3, as well as Examples 15 and 18 and Comparative Example 4, It can be seen that: By disposing the above inorganic dielectric layer on a surface of negative active material layer facing away from the negative current collector, lithium ion secondary battery after storage at 80° C. for 360 hours had a significantly reduced volume expansion ratio, and gas production at high temperature was effectively suppressed; the lithium precipitation on surface of negative electrode under high-current charging of the lithium ion secondary battery was effectively suppressed, thereby improving safety performance of battery; the capacity retention ratio (%) of lithium ion secondary battery after 100 1 C/1 C cycles at 45° C. was significantly increased; the Direct Current Resistance growth of lithium ion secondary battery after 100 1 C/1 C cycles at 45° C. was significantly suppressed, thereby improving cycle performance, especially the cycle performance at high temperature of battery; the capacity retention ratio of lithium ion secondary battery after storage at 60° C. for 180 days was significantly improved; and the Direct Current Resistance growth of lithium ion secondary battery after storage at 60° C. for 180 days was effectively suppressed, thereby improving the storage performance at high temperature of battery.

From the comparisons of Examples 1 to 7 and Comparative Examples 5 to 6, it can be seen that by using a first dielectric layer having a thickness in a predetermined range on the outer surface of the negative active material layer, the effects of the inorganic dielectric layer were effectively exerted, meanwhile battery had the improved safety performance, cycle performance and storage performance at high temperature.

From the comparisons of Examples 1 to 7 and Comparative Example 7, it can be seen that if a negative active material layer had a wetting velocity of electrolyte on per 10 cm×10 cm area of less than 2 μg/s, all of the safety performance, cycle performance and storage performance at high temperature of battery were affected, and lithium precipitation on a surface of a negative electrode in a battery was aggravated under high current charging.

From the comparisons of Example 1 to 7 and Comparative Example 8, since the inorganic dielectric layer was prepared by a coating method in Comparative Example 8, the inorganic dielectric layer was a continuous film layer bonded to outer surface of negative active material layer, the suppression on gas production, cycle performance and safety performance of battery were poor, and severe lithium precipitation occurred on surface of negative electrode under high current charging. Since the inorganic dielectric layer was bonded to negative active material layer through a binder, the inorganic dielectric layer tended to be peeled off due to swelling failure of the binder during cycle and storage processes. It was also generally difficult to obtain an inorganic dielectric layer having a thickness of less than 2 μm by coating method, and energy density of the resulting battery may also be affected.

The above mentioned descriptions only show particular implementations of the present invention and but are not intended to limit the protection scope of the present invention. Any modification or replacement readily figured out by a person skilled in the art within the technical scope disclosed in the present invention shall fall within the protection scope of the present invention. Therefore, the protection scope of the present invention shall be subject to the protection scope of the claims.

The invention claimed is:

1. A negative electrode plate, comprising:
    a negative current collector;
    a negative active material layer, disposed on at least one surface of the negative current collector, said negative active material layer comprises opposite first surface and second surface, wherein said first surface is disposed away from the negative current collector, wherein the negative active material is artificial graphite; and
    an inorganic dielectric layer, disposed on the first surface of the negative active material layer, said inorganic dielectric layer consisting of an inorganic dielectric material and wherein the inorganic dielectric material is alumina; said inorganic dielectric layer comprises a first dielectric layer on an outer surface of the negative active material layer, and the first dielectric layer has a thickness of from 100 nm to 200 nm;
    wherein the negative electrode plate has a compact density of from 1.2 g/cm$^3$ to 2.0 g/cm$^3$, a porosity of from 25% to 45% and a wetting velocity of electrolyte on per 10 cm×10 cm area of from 2 μg/s to 2.6 μg/s; and
    wherein
    the first dielectric layer has a discontinuous layered structure and has an opening extending through a thickness of the first dielectric layer, and the opening has a width of from 0.05 μm to 6 μm.

2. The negative electrode plate according to claim 1, wherein a ratio of reversible capacity per 1540 mm$^2$ area of the negative electrode plate to the thickness of the first dielectric layer is from 0.02 mAh/nm to 2 mAh/nm.

3. The negative electrode plate according to claim 1, wherein the first dielectric layer has a coverage on the first surface of the negative active material layer of from 70% to 95%.

4. The negative electrode plate according to claim 1, wherein the inorganic dielectric layer further comprises second dielectric layer on inner wall of at least a portion of pores inside the negative active material layer, and the second dielectric layer extends on a direction from the first surface to the second surface.

5. The negative electrode plate according to claim 4, wherein a depth of the second dielectric layer extending on the direction from the first surface to the second surface is from $1/1000$ to $1/10$ of the thickness of the negative active material layer.

6. The negative electrode plate according to claim 5, wherein the second dielectric layer has a thickness d of $0<d\leq 500$ nm; and/or
the second dielectric layer has a thickness d showing a gradient decrease on a direction from the first surface to the second surface.

7. The negative electrode plate according to claim 1, wherein said inorganic dielectric material has an average particle diameter $D_v50$ of from 1 nm to 10 nm.

8. A method for preparation of a negative electrode plate, comprising the steps of:

disposing a negative active material layer on at least one surface of a negative current collector, wherein the negative active material is artificial graphite;

depositing an inorganic dielectric material on a surface of the negative active material layer facing away from the negative current collector by vapor deposition, to obtain an inorganic dielectric layer including a first dielectric layer on an outer surface of the negative active material layer; and the first dielectric layer has a thickness of from 100 nm to 200 nm and wherein the inorganic dielectric material is alumina;

wherein the negative electrode plate has a compact density of from 1.2 g/cm$^3$ to 2.0 g/cm$^3$, a porosity of from 25% to 45% and a wetting velocity of electrolyte on per 10 cm×10 cm area of from 2 μg/s to 2.6 μg/s; and
wherein
the first dielectric layer has a discontinuous layered structure and has an opening extending through a thickness of the first dielectric layer, and the opening has a width of from 0.05 μm to 6 μm.

9. An electrochemical device, comprising a positive electrode plate, a negative electrode plate, a separator, and an electrolyte, wherein the negative electrode plate is the negative electrode plate according to claim 1.

* * * * *